(12) United States Patent
Zhang et al.

(10) Patent No.: US 9,866,213 B1
(45) Date of Patent: Jan. 9, 2018

(54) HIGH VOLTAGE SWITCH MODULE

(71) Applicant: United Silicon Carbide, Inc., Monmouth Junction, NJ (US)

(72) Inventors: Hao Zhang, Plainsboro, NJ (US); Xueqing Li, East Brunswick, NJ (US); Anup Bhalla, Princeton Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/259,418

(22) Filed: Sep. 8, 2016

(51) Int. Cl.
| | |
|---|---|
| *H03K 17/687* | (2006.01) |
| *H01L 23/498* | (2006.01) |
| *H01L 23/373* | (2006.01) |
| *H01L 21/48* | (2006.01) |
| *H01L 23/00* | (2006.01) |
| *H01L 23/495* | (2006.01) |

(52) U.S. Cl.
CPC ..... *H03K 17/6871* (2013.01); *H01L 21/4846* (2013.01); *H01L 23/3731* (2013.01); *H01L 23/49568* (2013.01); *H01L 23/49575* (2013.01); *H01L 23/49844* (2013.01); *H01L 24/29* (2013.01); *H01L 24/45* (2013.01); *H01L 24/48* (2013.01); *H01L 2224/29139* (2013.01); *H01L 2224/45124* (2013.01); *H01L 2224/45144* (2013.01); *H01L 2224/45147* (2013.01); *H01L 2224/48225* (2013.01); *H01L 2924/014* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,398,160 A | | 3/1995 | Umeda | |
| 6,822,842 B2* | | 11/2004 | Friedrichs | H03K 17/102 327/309 |
| 8,324,720 B2* | | 12/2012 | Schulz | H01L 23/34 257/691 |
| 8,760,214 B2* | | 6/2014 | Biela | H03K 17/08142 327/430 |
| 8,912,840 B2* | | 12/2014 | Aggeler | H03K 17/102 327/430 |
| 9,190,993 B1* | | 11/2015 | Li | H03K 17/60 |
| 9,312,847 B1 | | 4/2016 | Li | |
| 9,325,306 B1 | | 4/2016 | Li | |
| 2012/0014059 A1* | | 1/2012 | Zeng | H02M 7/003 361/690 |
| 2014/0145664 A1* | | 5/2014 | Castro | H02P 27/06 318/494 |
| 2014/0246681 A1 | | 9/2014 | Das et al. | |

* cited by examiner

*Primary Examiner* — Cassandra Cox

(74) *Attorney, Agent, or Firm* — Baker & Hostetler, LLP

(57) ABSTRACT

A high-voltage switch module, such as a cascode module, includes an electrically insulating heatsink with a patterned conductor layer on which high-voltage and low-voltage active semiconductor components are bonded, along with clamping, loading, and dynamic balancing components such as diodes, resistors, and capacitors. The heatsink may be alumina or aluminum nitride, for example. The conductor layer may be copper affixed to the heatsink via by direct-copper bonding or active metal brazing, for instance. High-voltage cascode modules may be formed using a low-voltage MOSFET in combination with a chain of silicon carbide normally-on n-channel JFET devices with a variety of configurations of clamping, loading, and balancing devices, for example.

20 Claims, 11 Drawing Sheets

HIGH VOLTAGE SWITCH MODULE

FIELD OF THE DISCLOSURE

This disclosure relates generally to semiconductor switches using multiple semiconductor devices, and particularly to high-voltage cascode switches that use multiple devices in series, and devices and methods for packaging such switches.

SUMMARY

A high-voltage switch module, such as a cascode module, includes an electrically insulating heatsink with a patterned conductor layer on which high-voltage and low-voltage active semiconductor components are bonded, along with clamping, loading, and dynamic balancing components such as diodes, resistors, and capacitors. The heatsink may be alumina or aluminum nitride, for example. The conductor layer may be copper affixed to the heatsink via by direct-copper bonding or active metal brazing, for instance. High-voltage cascode modules may be formed using a low-voltage MOSFET in combination with a chain of silicon carbide normally-on n-channel JFET devices with a variety of configurations of clamping, loading, and balancing devices, for example.

This summary is provided to introduce a selection of concepts in a simplified form that are further described below in the detailed description. This summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale.

DETAILED DESCRIPTION

Figure 1:
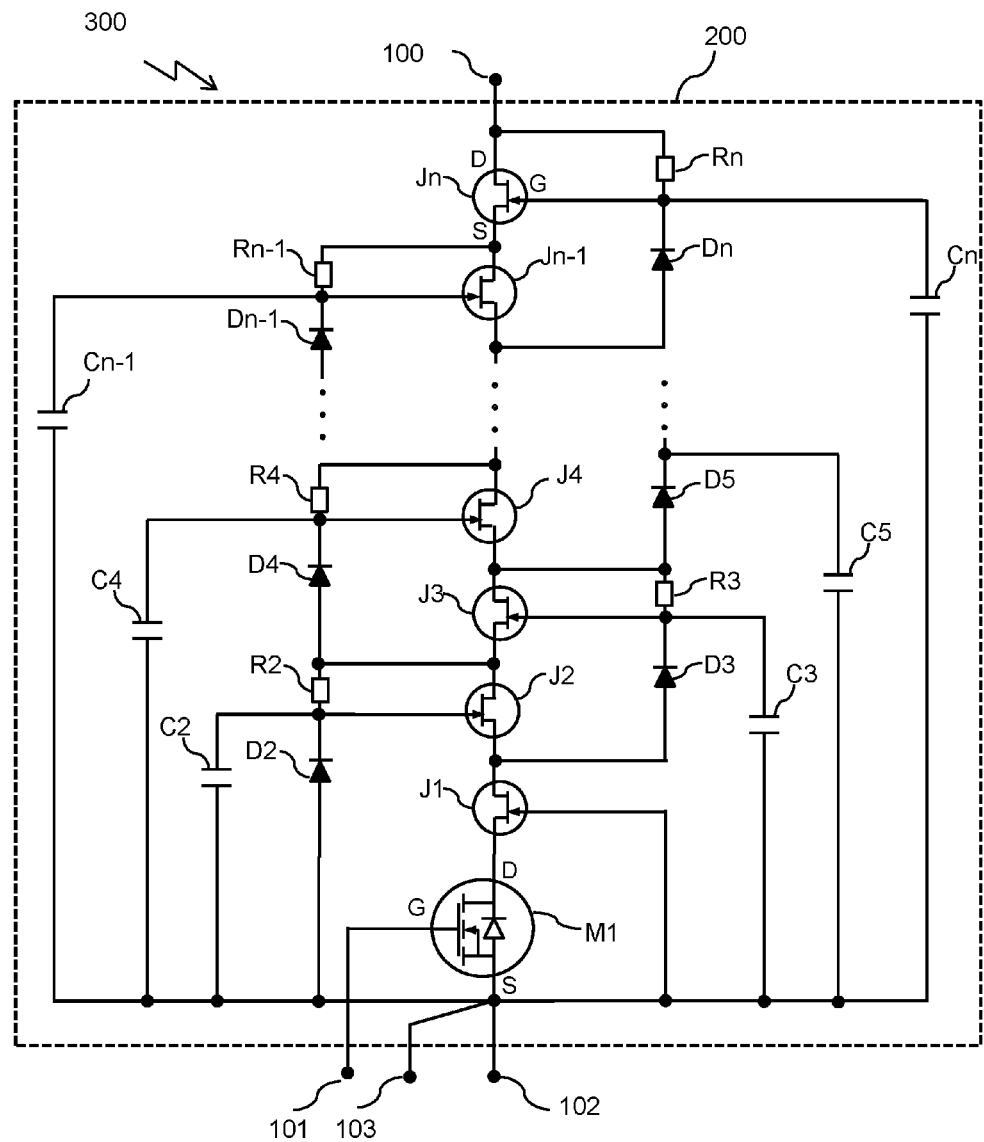
FIG. 1 is a schematic of an example high voltage switch circuit.

A high-voltage switch module, such as a cascode module, may be formed to include an electrically insulating heatsink with a patterned conductor layer on which high-voltage and low-voltage active semiconductor components are bonded, along with clamping, loading, and dynamic balancing components such as diodes, resistors, and capacitors, allowing higher isolation and lower stray capacitances, for instance. The heatsink may be alumina or aluminum nitride, for example. The conductor layer may be copper affixed to the heatsink via by direct-copper bonding or active metal brazing, for instance. High-voltage cascode modules may be formed using a low-voltage MOSFET in combination with a chain of silicon carbide normally-on n-channel JFET devices with a variety of configurations of clamping, loading, and balancing devices, for example.

To enhance performance, multiple active devices may be used in parallel. For example, two or more MOSFET devices may be installed in parallel, or two or more JFET devices may be used in each position in the chain.

For each JFET chip in the chain from the second JFET chip to the last JFET chip, a load circuit comprising a resistor may be used, where the load circuit is connected between the drain of the JFET chip and the gate of the JFET chip. Similarly, for each JFET chip in the chain from the second JFET chip in the chain to the last JFET chip in the chain, a dynamic balancing circuit comprising a capacitor associated with the JFET chip may be used, where a first connection of the dynamic balancing circuit is connected to the gate of the JFET chip, and a second connection of the dynamic balancing circuit is connected to the source of the first MOSFET chip.

An additional clamping device associated with the first JFET chip in the chain may be used, where an anode of the additional clamping device is connected to the source of the first JFET chip in the chain and a cathode of the additional clamping device is connected to the gate of the second JFET chip in the chain, where the gate of the first JFET chip in the chain is connected to the source of the first MOSFET chip.

The top surface of the patterned conductor layer may be plated, e.g., with nickel, gold, or an alloy of nickel or gold. The clamping devices, components of the load circuits, and components of the dynamic balancing circuits may be connected to the top surface of the patterned copper layer by soldering or wire bonding, for example. The backside connections of the active devices may be bonded to the patterned conductor via a die-attach material such as a solder alloy, silver sintering paste or film, or TLP, for example.

The high-voltage switch module may include input, control, and output terminals that are connected to the top surface of the patterned conductor layer by soldering or press-fit.

Wire bonding may be used to complete connection of the active devices or the clamping, loading, or balancing devices, either for connections between devices or between devices and the patterned conductor layer. For example, aluminum, wire, or copper wire or tapes may be used to form such connections. The module may be enclosed in a housing that is sealed with a silicone gel or epoxy, for example.

The use of the a patterned circuit directly on an insulating heatsink has several advantages over conventional approaches, including requiring fewer parts and fewer production steps, lower thermal resistance of the assembly, higher isolation, reduced stray capacitances, and higher performance and reliability thereby.

FIG. 1 is schematic diagram of an example high voltage switch 200 of a switch module 300. Switch 200 has a drain terminal 100, a source terminal 102, a gate terminal 101, and a kelvin source terminal 103 for gate signal ground reference. U.S. Pat. Nos. 9,190,993, 9,312,847, and 9,325,306, all entitled "High Voltage Switch," granted Xueqing Li on Nov. 17, 2015, Apr. 12, 2016, and Apr. 26, 2016 respectively, which are herein incorporated by reference in their entirety, describe high voltage switches of this kind, including many useful variations and the advantages thereof.

Referring to FIG. 1, a high-voltage switch 200 is formed by connecting a number of normally-on transistors J1-Jn in series with each other, where the drain of each transistor is connected to the source of the next. The chain of transistors J1-Jn is connected in series with a normally-off switch component M1, where the drain of the normally-off switch component M1 is connected to the source of the first transistor J1 in the chain. For each transistor J2-Jn−1, a voltage-clamping device, such as a diode, is connected with the anode of the voltage-clamping device connected to the source of the transistor and the cathode of the voltage-clamping device connected to the gate of the next transistor in the chain. For the first transistor J1, an additional voltage-clamping device, such as a diode, is connected with the anode of the additional voltage-clamping device connected to the source of the normally-off switch component M1 and the cathode of the additional voltage-clamping device connected to the gate of the second transistor J2. The transistors J1-Jn may be, for example, silicon carbide (SiC) normally-on junction field effect transistors (JFETs). SiC JFETs are reliable and the technology is relatively mature. 1200 volts SiC normally-on junction field effect transistors (JFETs) are now commercially available. The normally-off switch component M1 may be, for example, a silicon MOSFET with a blocking voltage between 15V and 50V. The blocking voltage of the high voltage switch 200 may be between 3,300 volts and 15,000 volts, for example.

D2 to Dn are voltage-clamping devices. A voltage-clamping device can be any device or circuit block that conducts a very small leakage current when the voltage is below the desired clamp voltage, and conducts a substantial current when the voltage reaches the desired clamp voltage. For example, avalanche diodes work well in this function.

R2 to Rn are load circuits used to provide the currents for biasing the clamping devices D2 to Dn, respectively. A load circuit could be just a resistor with a predetermined value of resistance, or could be a dynamic resistor having increased resistance with increased terminal voltage in order to provide a controlled leakage current at high terminal voltage and a low impedance at a low terminal voltage, for example.

C2 to Cn are dynamic balancing circuits used to synchronize the turn-on process and the turn-off process of the normally-on transistors J2-Jn. A dynamic balancing circuit could be a capacitor or a capacitor and a resistor connected in series, for example.

The drain of the last transistor Jn in the chain is connected to the module drain terminal 100. The gate of the normally-off switch component M1 is connected to the module gate terminal 101. The source of the normally-off switch component M1 is connected to the module source terminal 102. The module kelvin source terminal 103 is also directly connected to the source of the normally-off switch component M1.

Figure 2:
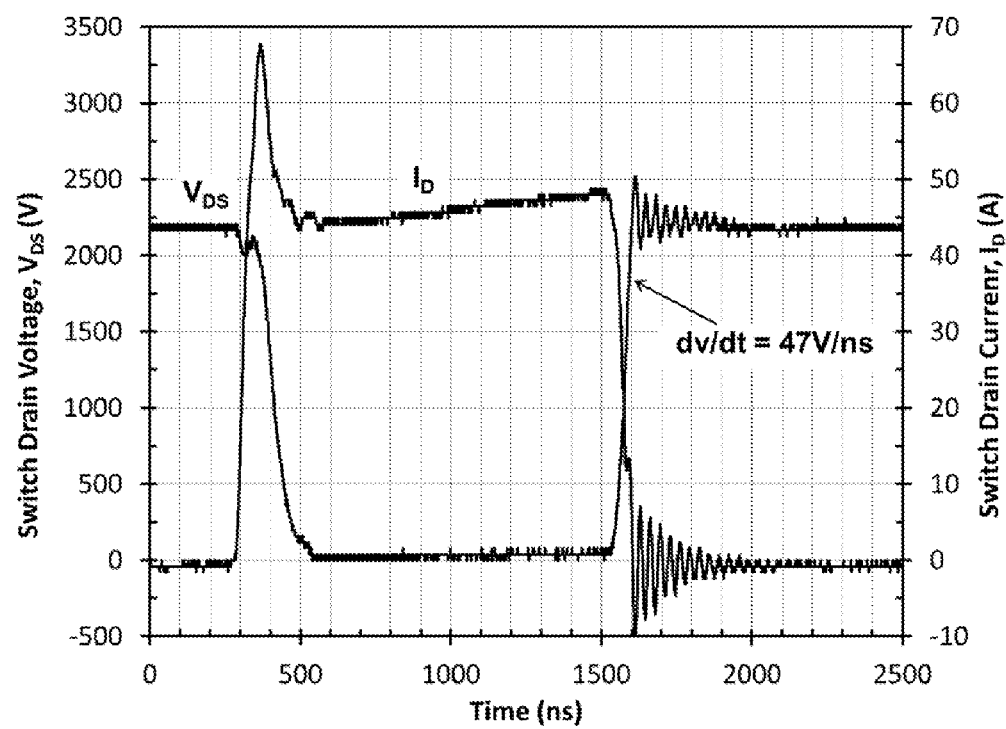
FIG. 2 is a plot of inductive load switching waveforms of an example implementation of the high voltage switch circuit of FIG. 1 using five normally-on SiC JFETs.

FIG. 2 which shows a plot of the measured exemplary inductive load current and voltage switching waveforms of the high voltage switch 200 demonstrated experimentally by series-connecting five 1200 volts, 20 milliohms SiC normally-on JFETs. The high voltage switch 200 has an extremely fast switching speed, and its voltage changing rate (dv/dt) during switching transients can be very high. In the example of FIG. 2, the dv/dt is as high as 47 Volts/ns during turn-off transient. The effects of the high blocking voltage and high dv/dt during switching transients should be considered carefully in the design of the high voltage switch 200 in order to make it work properly.

Figure 3:
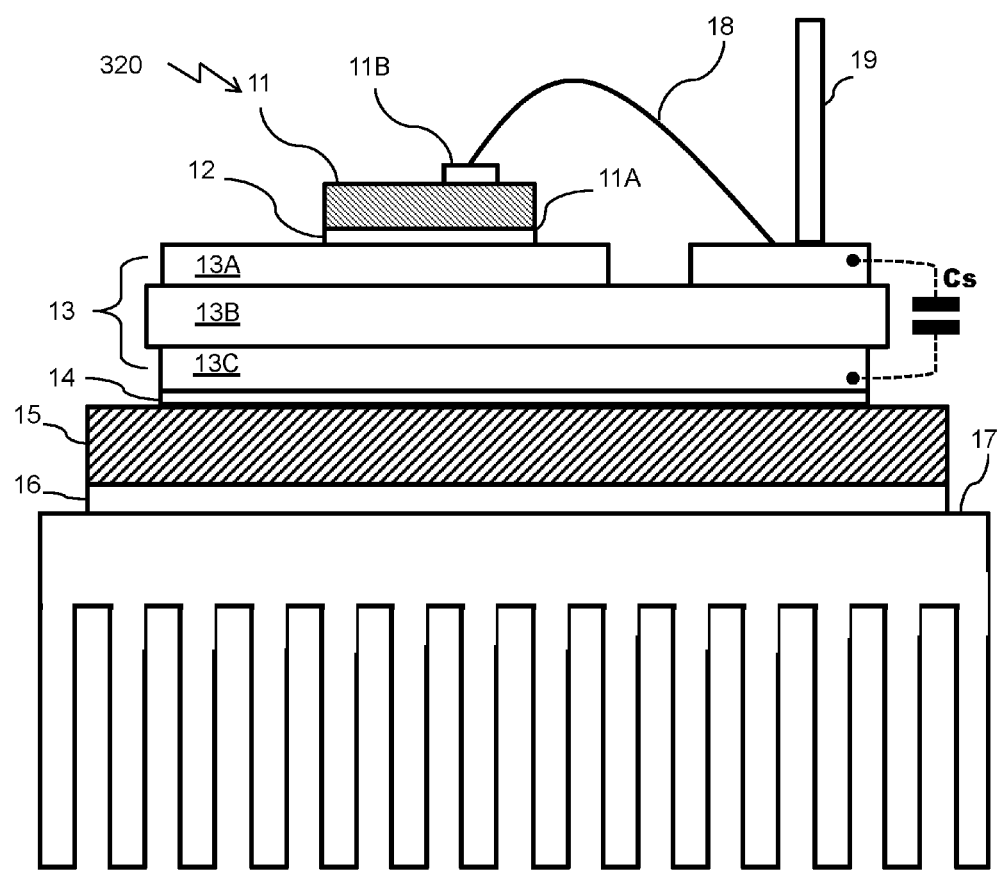
FIG. 3 is a cross-sectional view of an example prior art multi-layer assembly with electrical components, an insulating substrate, and a baseplate.

FIG. 3 shows a block diagram illustrating a prior art method of forming a power module. The power module in FIG. 3 includes a baseplate 15, an insulating substrate 13, a power transistor chip 11, and a power connector 19. The baseplate 15 is made of a material such as copper, AlSiC, or the like, having properties of good heat dissipation and mechanical rigidity. A heatsink 17 may be attached onto the back surface of the baseplate 15 through a thermal interface layer 16 in order to dissipate the heat generated by the power transistor chip 11. The thermal interface layer 16 may be made of silicone, graphite based cream, or phase change materials, for example. The baseplate 15 may be around 3 millimeter thick. The insulating substrate 13 supports the power chip 11 and provides electrical isolation between the baseplate 15 and power transistor chip 11. The insulating substrate 13 has an insulating layer 13B, a patterned top conductive layer 13A direct-bonded on the top surface of the insulating layer 13B, and a bottom conductive layer 13C direct-bonded on the bottom surface of the insulating layer 13B. The insulating layer 13B can be made of material such as aluminum nitride (AlN), alumina ($Al_2O_3$), or the like, which are superior in heat dissipation and electrical insulation. The conducting layer 13A and 13B may be made of Cu or Al, for example. The insulating substrate 13 may be attached onto the top surface of the baseplate 15 through a solder or Ag sintering layer 14, for instance. The power transistor chip 11 may be a power MOSFET, IGBT, JFET, or BJT made of silicon or silicon carbide, for example. The power transistor chip 11 has a backside power electrode 11A formed on its bottom surface, a top power electrode 11B, and a control electrode (not shown) on its top surface. The power electrode 11A on the bottom surface of the power transistor chip 11 is attached to the patterned top conductive layer 13A of the insulating substrate 13 through a die-attach material layer 12 that may be a made of a solder alloy, silver sintering paste or film, or TLP, for example. The top power electrode 11B and the control electrode of the power transistor chip 11 are connected to the patterned top conductive layer 13A of the insulating substrate 13 through bond wires 18. The bond wires may be made of aluminum, gold, or copper, for example. The power connector 19 may be attached to the patterned top conductive layer 13A of the insulating substrate 13 by soldering or by press fit, for example.

The insulating substrate 13 has a very large stray capacitance, indicated as Cs on FIG. 3, between its patterned top conductive layer 13A and its bottom conductive layer 13C. The stray capacitance Cs may typically be about 6 pF/$cm^2$ for a 1.5 millimeter aluminum nitride substrate. This is not an issue for conventional high-voltage IGBT modules because they are usually operating at a switching frequency lower than 1 kHz, typically 500 Hz, and at a voltage changing rate (dv/dt) less than 10V/ns.

But for the high voltage switch 200 of FIG. 1, if it is constructed with the prior art method in FIG. 3, the stray capacitance Cs in FIG. 3 could cause serious problems. This is because the high voltage switch 200 in FIG. 1 is an extremely fast switch and can be operated at a switching frequency higher than 5 kHz with a dv/dt higher than 40V/ns. For example, a 10 kV-200 A-rated high voltage switch formed according the schematic of FIG. 1 using seven 1.7 kV SiC normally-off JFETs connected in series may require a total SiC JFET chip area of about 9 cm$^2$, and an estimated total copper area of about 50 cm$^2$ for landing the voltage-clamping devices D2-D7, the load circuits R2-R7, the dynamic balancing circuits C2-C7, the normally-off switch component M1, the SiC JFETs J1-J7, and power connectors. The potential of the patterned top conductive layer 13A of the insulating substrate 13 in FIG. 2 is not uniformly distributed. Assuming 30% of the patterned top conductive layer 13A experiences a high dv/dt during switching process, then the effective stray capacitance Cs may be about 100 pF. Therefore, during a switching transient with a dv/dt value of 40V/ns, a current spike of 4 Amperes will be generated flowing through the stray capacitance Cs into the heatsink 17 in FIG. 3, which may cause serious electromagnetic interference (EMI) problems and may even cause the dynamic balancing circuits C2 to C7 not to work properly. In addition, the stray capacitance Cs will induce a power loss of 36 watts when operated at a DC bus voltage of 6,000 volts and a switching frequency of 10 kHz. These problems become worse for a module with higher current ratings.

Figure 4:
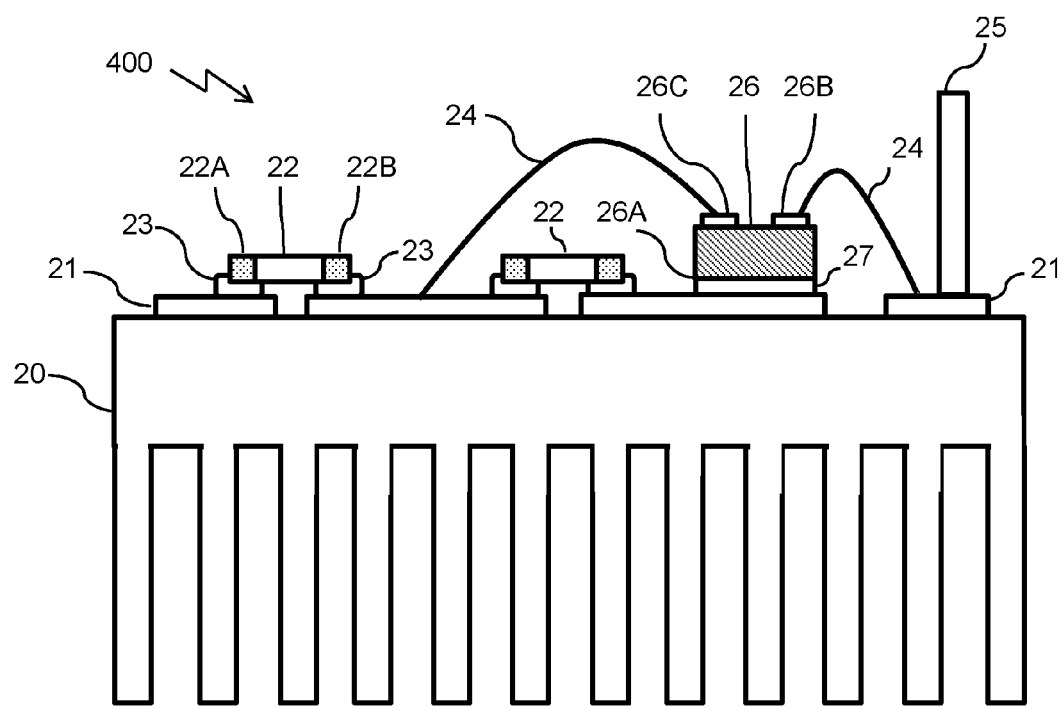
FIG. 4 is a cross-sectional view of an example assembly with electrical components on a circuit pattern, where the circuit pattern is atop an electrically insulating heatsink.

FIG. 4 is a cross-sectional view of an example module package 400 that addresses the shortcomings of the structure of FIG. 3, whereby the high voltage switch such as the high voltage switch 200 of FIG. 1 may be realized. The module 400 includes an insulating heatsink 20, a power chip 26, two accessory components 22, and a power connector 25. The insulating heatsink 20 may be made of a material such as AlN, Al$_2$O$_3$, or the like, having superior properties in heat dissipation and electrical insulation. The insulating heatsink 20 may have a fin structure, as shown in FIG. 4, or not. Similarly, the insulating heatsink 20 may be designed to be either air-cooled or liquid-cooled, or incorporate other features of heat sinks generally.

The accessory components 22 may be avalanche diodes, capacitors, and resistors, for example, which are used to form the voltage-clamping devices D2-Dn, load circuits R2-Rn, or dynamic balancing circuits C2-Cn of the high voltage switch 200 of FIG. 1. In the example of FIG. 4, the accessory components 22 are surface-mount devices with two terminals 22A and 22B. The power chip 26 may be a chip of the normally-on transistors J1-Jn or the normally-off switch component M1 of the high voltage switch 200 of FIG. 1. The power chip 26 has a drain electrode 26A formed on its bottom surface, and a source electrode 26B and a gate electrode 26C formed on its top surface.

On the top surface of the insulating heatsink 20, a conductive layer 21 is formed by a process, such as direct-copper bonding (DCB) or active metal braze (AMB). The conductive layer 21 is patterned to form the circuit of the high voltage switch 200 in FIG. 1. The upper surface of the conductive layer 21 is preferred to be plated with nickel and/or further be flash-plated with gold to make the upper surface suitable for aluminum wire bonding, soldering, and silicon and silicon carbide die attaching.

The terminals 22A and 22B of the accessory components 22 may be connected to the patterned conductive layer 21 through solder joints 23 by soldering. The drain electrode 26A of the power chip 26 is attached to the patterned top conductive layer 21 through a die-attach material layer 27 that may be made of a solder alloy, silver sintering paste or film, or TLP, for example. The top source electrode 26B and the gate electrode 26C of the power chip 26 are connected to the patterned top conductive layer 21 through bond wires 24 that may be made of aluminum, gold, or copper, for example. The power connector 25 may be attached to the patterned top conductive layer 21 by soldering or press fit, for example.

All of the components of the high voltage switch 200 in FIG. 1, including the normally-off switch component M1, the normally-on transistors J1-Jn, the voltage-clamping devices D2-Dn, the load circuits R2-Rn, and the dynamic balancing circuits C2-Cn, may be electrically connected in a structure such as that shown in FIG. 4 through the bond wires 24 or the conductive traces of the pattern (not shown) of the top conductive layer 21. The whole circuit of the high voltage switch 200 in FIG. 1 may thus be directly formed on the insulating heatsink 20. Therefore, in the module of FIG. 4, the stray capacitance is negligible, as compared to the stray capacitance Cs of FIG. 3, by eliminating the conductivity of the heat sink. The problems related to the stray capacitance Cs are thereby eliminated. In addition, there are fewer layers of different materials in the module in FIG. 4 than the prior-art module in FIG. 3, which simultaneously translates into fewer production steps, lower thermal resistance, and higher reliability.

Figure 5:
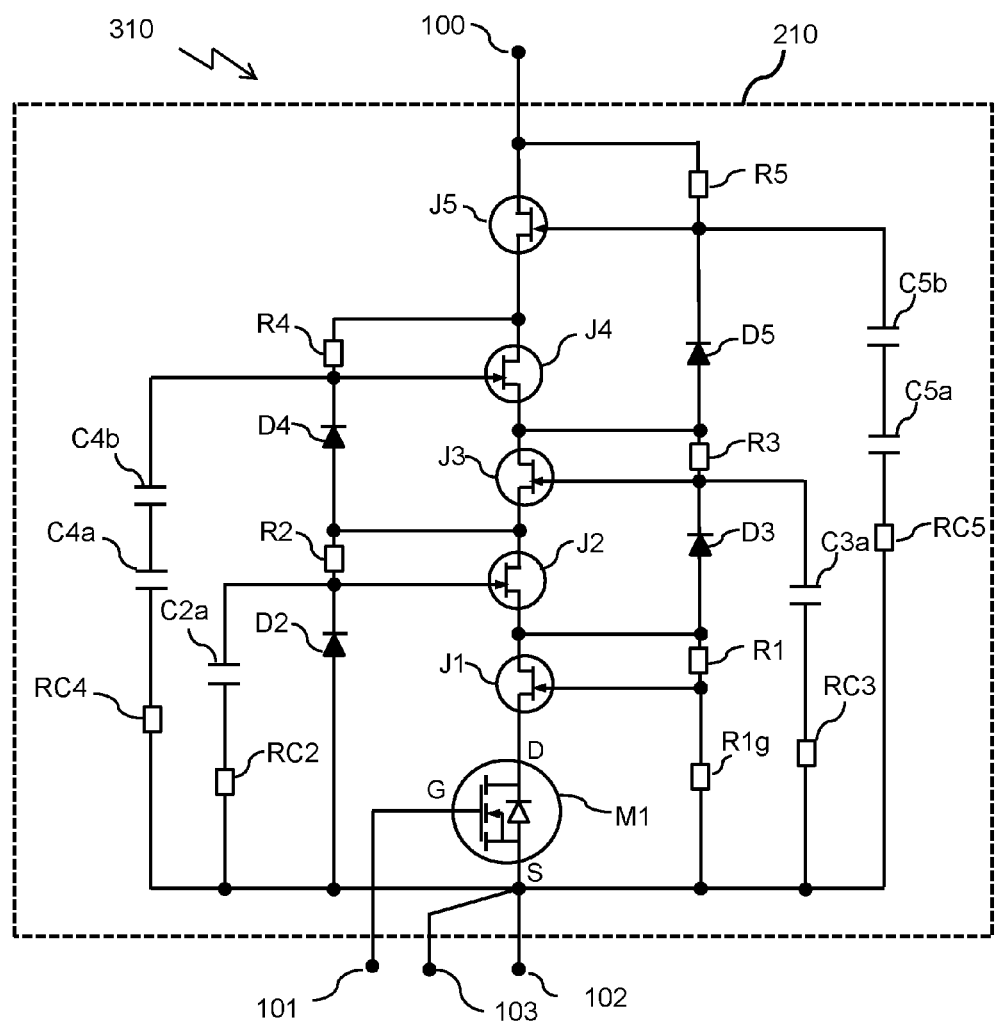
FIG. 5 is a schematic diagram of an alternative example high voltage switch circuit.

FIG. 5 shows a circuit schematic diagram of an alternative switch module 310 using an alternative high voltage switch 210. Switch 210 of FIG. 5 is similar to the high-voltage switch 200 of FIG. 1. Here in FIG. 5, the high-voltage switch 210 includes five normally-on transistors J1-J5 connected in series and four voltage clamping diodes D2-D5. A first dynamic balancing circuit C5 is formed by two capacitors C5a and C5b and a resistor RC5 connected in series. A second dynamic balancing circuit is formed by two capacitors C4a and C4b and a resistor RC4 connected in series. A third dynamic balancing circuit C3 is formed by a capacitor C3a and a resistor RC3 connected in series, and a fourth dynamic balancing circuit C2 is formed by a capacitor C2a and a resistor RC2 connected in series. The resistors RC2-RC5 are used to damp the possible oscillation during switch transients. In addition, a resistor R1g is connected between the gate terminal of the normally-on transistor J1 and the source terminal of the normally-off switch component M1 to damp the possible oscillation during switch transients. A resistor R1 is connected between the drain terminal and the gate terminal of the normally-on transistor J1 for the bias current of the voltage-clamping devices D3 and D5 to bypass the normally-on transistor J1, and the normally-off switch component M1, and continue to the source terminal 102 of the module 310.

Figure 6:
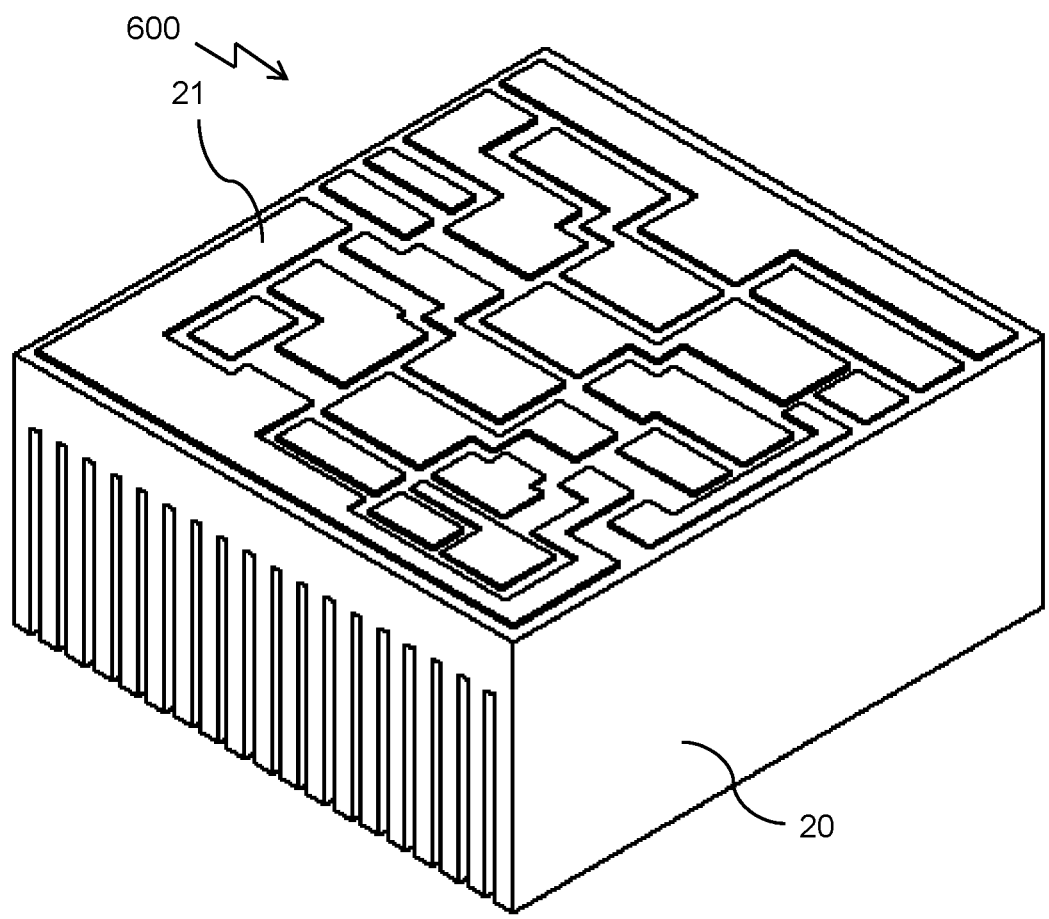
FIG. 6 is a perspective view of an example a circuit pattern layer atop a heatsink.

FIG. 6 shows a three-dimensional view of an example assembly 600 using insulating heatsink 20 with a patterned top conductive layer 21. The pattern of the conductive layer 21 forms several of the interconnections necessary realize the circuit of the high voltage switch 210 of FIG. 5. Portions of the patterned top conductive layer 21 serve as the landing pads for the components and connectors of the high voltage switch 210 of FIG. 5. Of course, the pattern shown of the top conductive layer 21 shown in FIG. 6 is just one of many variations possible, as will be appreciated by those skilled in the art. In addition, many variations in the circuit components and configurations will be appreciated in view of U.S. Pat. Nos. 9,190,993, 9,312,847, and 9,325,306.

Figure 7:
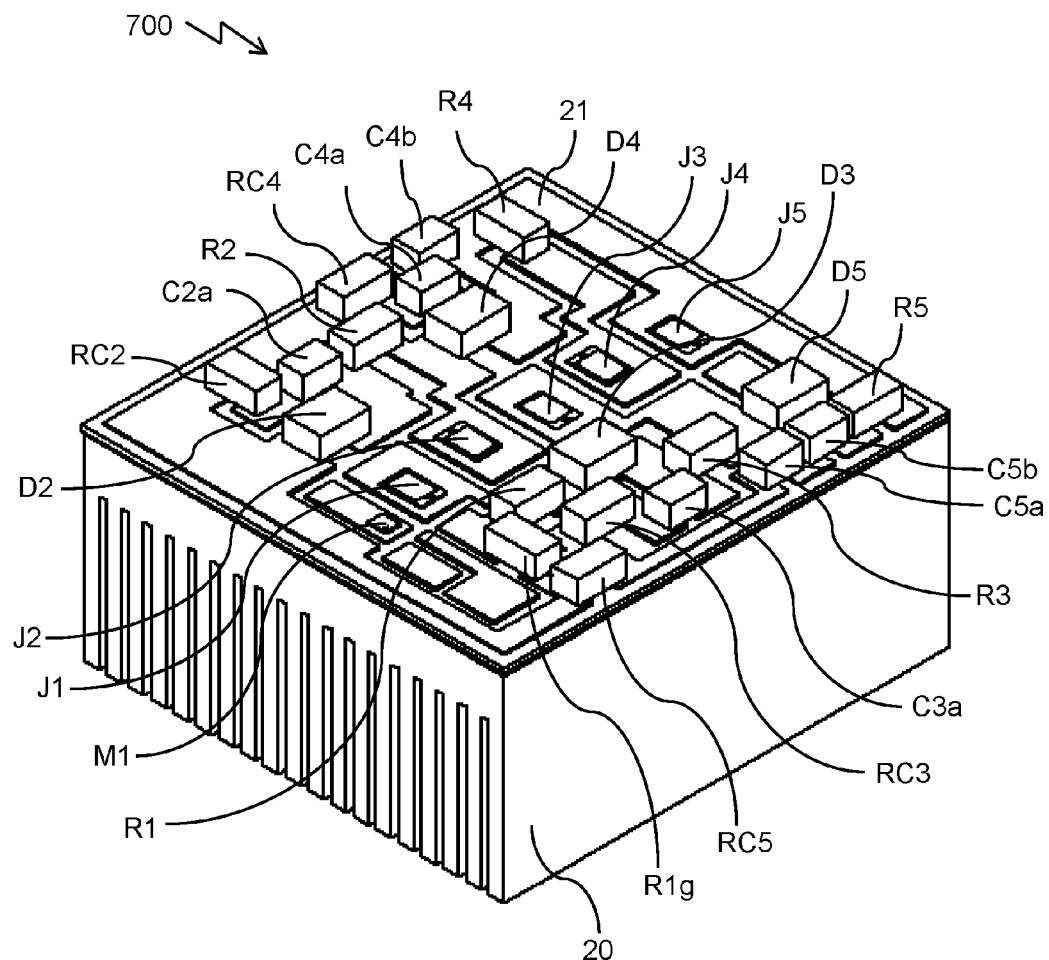
FIG. 7 is a perspective view of an example high voltage switch module with circuit components on a heatsink.

FIG. 7 shows a three-dimensional view of an example assembly 700 for implementing a high voltage switch such as high voltage switch 210 of FIG. 5. Here in FIG. 7, the circuit components are attached to the patterned top conductive layer 21 of the insulating heatsink 20 that were illustrated in FIG. 6. On the top surface of the normally-on transistor chips J1-J5, the larger pad is the source terminal and the smaller pad is the gate terminal.

Figure 8:
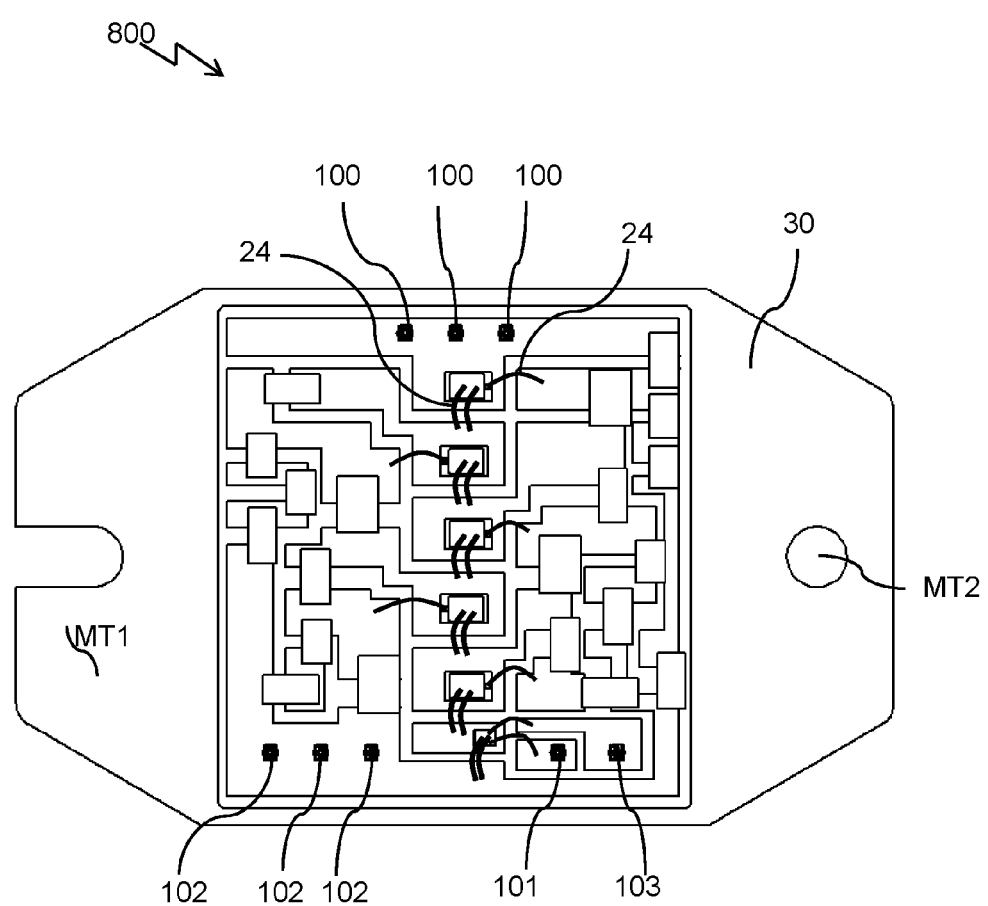
FIG. 8 is a top view of an example high voltage switch module with a housing without encapsulant, showing interior components.

FIG. 8 shows a top view of an example assembly 800 for implementing a high voltage switch such as high voltage switch 210 of FIG. 5. Assembly 800 includes assembly 700 of FIG. 7. Assembly 800 further includes: terminals 100, 101, 102, and 103, implemented as pins; bond wires 24 for connecting the gate terminals and source terminals of the power chips of the normally-off switch component M1 and the normally-on transistors J1-J5 to the patterned top conductive layer 21; and a housing 30 encasing the patterned top conductive layer 21 and all circuit components. For clarity, the labels of the electrical components are omitted in this view. The housing 30 may be attached to the insulating heatsink 20 by a high bonding strength adhesive such as epoxy adhesive or other type of adhesives. The housing 30 includes a mounting hole MT1 and mounting tab MT2 used to mount the high voltage switch 210 to a platform (not shown). The terminals 100 and 102 are power terminals and each of them contains three connectors for connecting high current.

Figure 9:
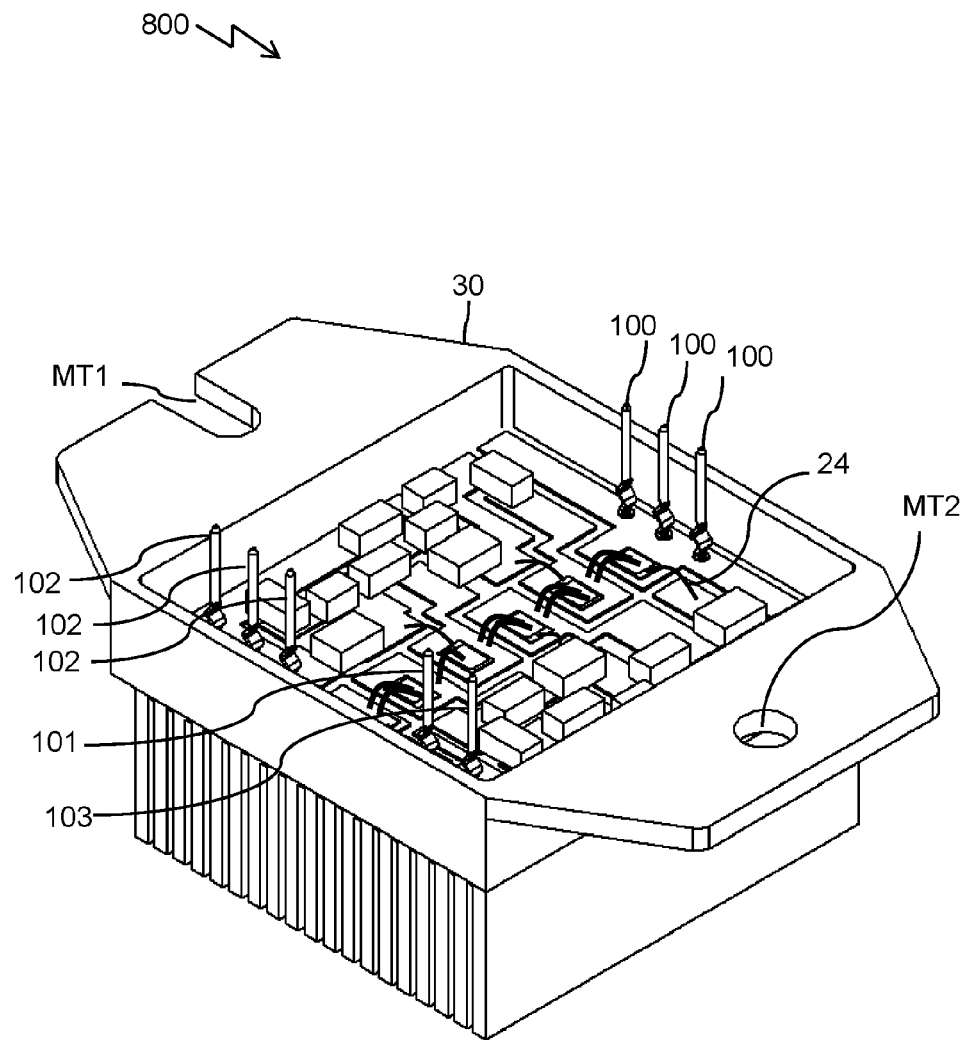
FIG. 9 is a perspective view of an example high voltage switch module with a housing without encapsulant, showing interior components and a heatsink.

FIG. 9 is a perspective view of the assembly 800 of FIG. 8, showing the terminal pins 100, 101, 102, and 103 extending above the plane of the housing 30, and the insulated heatsink 20 extending below the housing 30.

Figure 10:
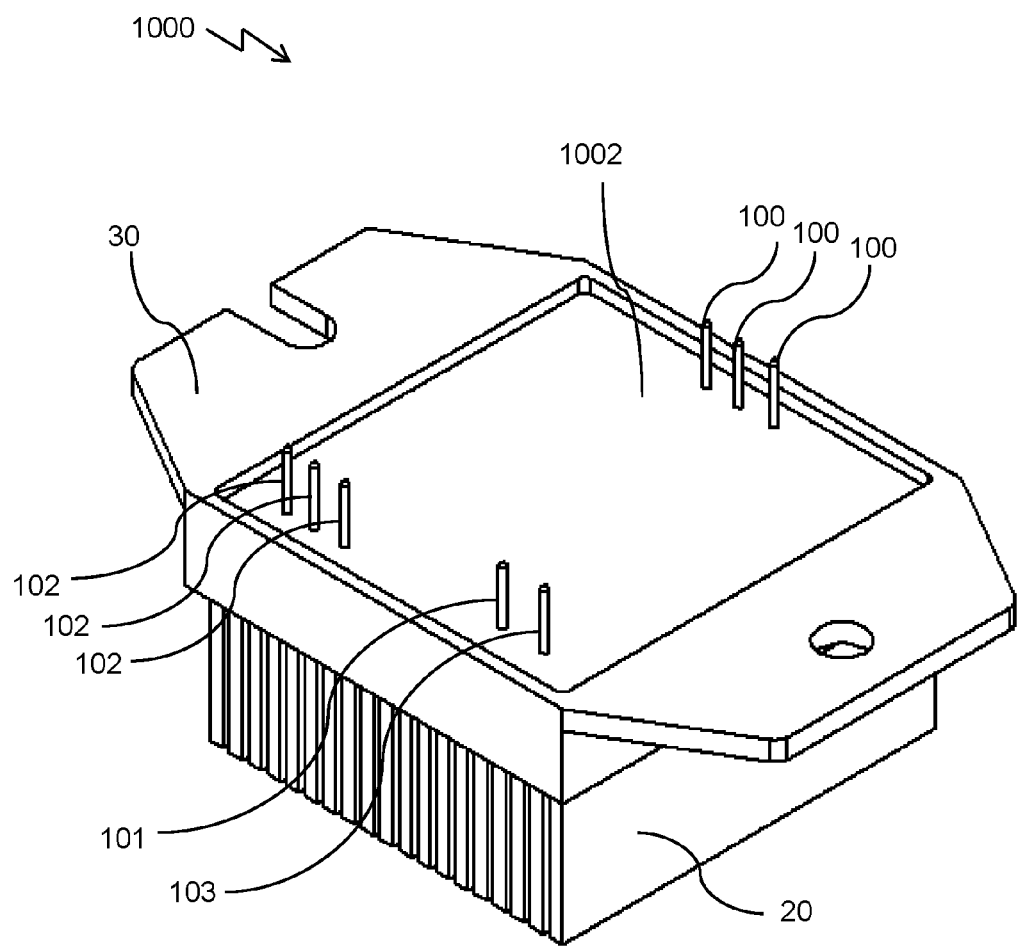
FIG. 10 is a perspective exterior view of an example high voltage switch module with a housing and encapsulant.

FIG. 10 is a perspective view of an example completed assembly 1000 of a high voltage switch module. Assembly 1000 includes assembly 800 of FIGS. 8 and 9. Here in FIG. 10, the power chips of the normally-off switch component M1 and the normally-on transistors J1-J5, as well as all accessory components, are encapsulated with a dielectric material such as silicone gel (not shown) to avoid arc. An epoxy encapsulant 1002 is deposited on top of the dielectric material to resist moisture as well as offer mechanical robustness. As in FIG. 9, the terminal pins 100, 101, 102, and 103 extend above the plane of the housing 30, and the insulated heatsink 20 extending below the housing 30.

Figure 11:
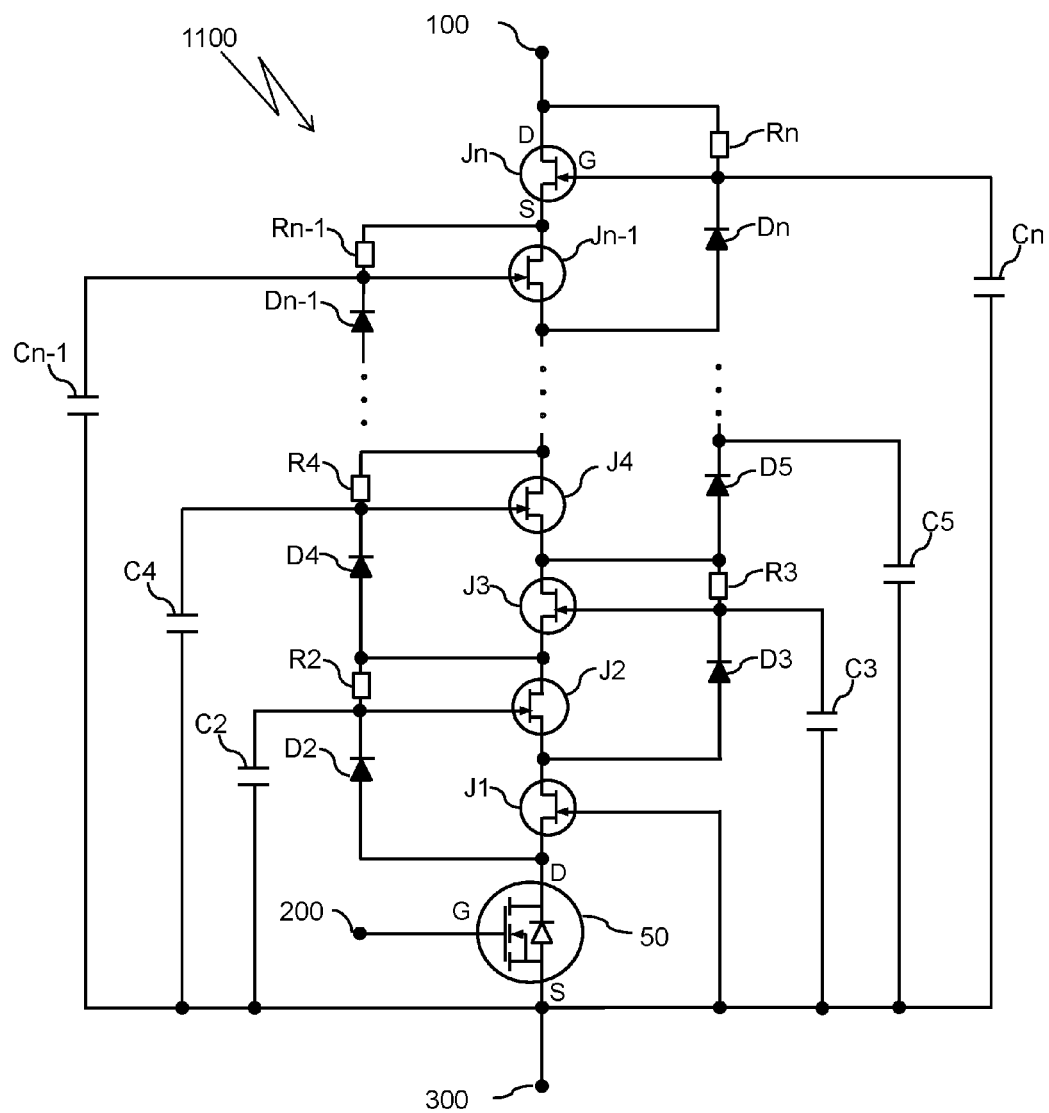
FIG. 11 is a schematic diagram of an alternative example high voltage switch circuit.

FIG. 11 shows a circuit schematic diagram of an alternative high voltage switch 1100 for use in the modules described herein. Switch 1100 of FIG. 11 is similar to the high-voltage switch 200 of FIG. 1. Here in FIG. 11, D2 is an additional clamping device associated with the first JFET chip in the chain, where an anode of the additional clamping device D2 is connected to the source of the first JFET chip in the chain J1 and a cathode of the additional clamping device D2 is connected to the gate of the second JFET chip in the chain J2, where the gate of the first JFET chip in the chain J1 is connected to the source of the first MOSFET chip 50.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention and to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:
1. A high-voltage switch module comprising:
  a. an electrically insulating heatsink;
  b. a patterned conductor the comprising a top surface and a bottom surface, where the bottom surface of the patterned conductor is bonded directly to a top surface of the heatsink;
  c. a first MOSFET chip, the first MOSFET chip being a normally-off n-channel device having a gate terminal and a source terminal formed on a top surface and a drain terminal on a bottom surface, where the drain terminal of the first MOSFET chip is connected to a MOSFET pad of the patterned conductor by a die-attach material;
  d. a chain of JFET chips, where the JFET chips in the chain are silicon carbide normally-on n-channel devices having a gate terminal and a source terminal on a top surface of the JFET chip and a drain terminal on a bottom surface of the JFET chip, where the JFET chips in the chain are connected in series drain-to-source, where the source of the first JFET chip in the chain is connected to the drain of the first MOSFET chip, and where the drain terminal of each JFET chip in the chain is connected to a JFET pad of the conductor layer by a die-attach material; and
  e. for each JFET chip in the chain from the second JFET chip to the penultimate JFET chip, a clamping device associated with the JFET chip, where an anode of the clamping device is connected to the source of the JFET chip, and a cathode of the clamping device is connected to the gate of the next JFET chip in the chain.

2. The high-voltage switch module of claim 1, wherein the insulating heatsink comprises aluminum nitride or alumina.

3. The high-voltage switch module of claim 1, wherein:
  a. the patterned conductor comprises copper; and
  b. the bottom surface of the patterned conductor is attached to directly the top surface of the heatsink.

4. The high-voltage switch module of claim 3, wherein the bottom surface of the patterned conductor is attached to the top surface of the heatsink by direct-copper bonding or active metal brazing.

5. A high-voltage switch module, comprising:
  a. an electrically insulating heatsink;
  b. a patterned conductor the comprising a top surface and a bottom surface, where the bottom surface of the patterned conductor is bonded directly to a top surface of the heatsink;
  c. a first MOSFET chip, the first MOSFET chip being a normally-off n-channel device having a gate terminal and a source terminal formed on a top surface and a drain terminal on a bottom surface, where the drain terminal of the first MOSFET chip is connected to a MOSFET pad of the patterned conductor by a die-attach material;
  d. a chain of JFET chips, where the JFET chips in the chain are silicon carbide normally-on n-channel devices having a gate terminal and a source terminal on a top surface of the JFET chip and a drain terminal on a bottom surface of the JFET chip, where the JFET chips in the chain are connected in series drain-to-source, where the source of the first JFET chip in the chain is connected to the drain of the first MOSFET chip, and where the drain terminal of each JFET chip in the chain is connected to a JFET pad of the conductor layer by a die-attach material;
e. for each JFET chip in the chain from the second JFET chip to the penultimate JFET chip, a clamping device associated with the JFET chip, where an anode of the clamping device is connected to the source of the JFET chip, and a cathode of the clamping device is connected to the gate of the next JFET chip in the chain; and
f. a second MOSFET chip connected in parallel with the first MOSFET chip;
g. an additional JFET chip connected in parallel with each JFET chip in the chain;
h. for each JFET chip in the chain from the second JFET chip to the last JFET chip, a load circuit comprising a resistor, the load circuit being connected between the drain of the JFET chip and the gate of the JFET chip;
i. for each JFET chip in the chain from the second JFET chip in the chain to the last JFET chip in the chain, a dynamic balancing circuit comprising a capacitor associated with the JFET chip, where a first connection of the dynamic balancing circuit is connected to the gate of the JFET chip, and a second connection of the dynamic balancing circuit is connected to the source of the first MOSFET chip; or
j. an additional clamping device associated with the first JFET chip in the chain, where an anode of the additional clamping device is connected to the source of the first JFET chip in the chain and a cathode of the additional clamping device is connected to the gate of the second JFET chip in the chain, where the gate of the first JFET chip in the chain is connected to the source of the first MOSFET chip.

6. The high-voltage switch module of claim 5, comprising an additional JFET chip connected in parallel with each JFET chip in the chain.

7. The high-voltage switch module of claim 5, comprising for each JFET chip in the chain from the second JFET chip to the last JFET chip, a load circuit comprising a resistor, the load circuit being connected between the drain of the JFET chip and the gate of the JFET chip.

8. The high-voltage switch module of claim 5, comprising, for each JFET chip in the chain from the second JFET chip in the chain to the last JFET chip in the chain, a dynamic balancing circuit comprising a capacitor associated with the JFET chip, where a first connection of the dynamic balancing circuit is connected to the gate of the JFET chip, and a second connection of the dynamic balancing circuit is connected to the source of the first MOSFET chip.

9. The high-voltage switch module of claim 5, comprising an additional clamping device associated with the first JFET chip in the chain, where an anode of the additional clamping device is connected to the source of the first JFET chip in the chain and a cathode of the additional clamping device is connected to the gate of the second JFET chip in the chain, where the gate of the first JFET chip in the chain is connected to the source of the first MOSFET chip.

10. The high-voltage switch module of claim 5, comprising a second MOSFET chip connected in parallel with the first MOSFET chip.

11. A high-voltage switch module, comprising:
a. an electrically insulating heatsink;
b. a patterned conductor the comprising a top surface and a bottom surface, where the bottom surface of the patterned conductor is bonded directly to a top surface of the heatsink;
c. a first MOSFET chip, the first MOSFET chip being a normally-off n-channel device having a gate terminal and a source terminal formed on a top surface and a drain terminal on a bottom surface, where the drain terminal of the first MOSFET chip is connected to a MOSFET pad of the patterned conductor by a die-attach material;
d. a chain of JFET chips, where the JFET chips in the chain are silicon carbide normally-on n-channel devices having a gate terminal and a source terminal on a top surface of the JFET chip and a drain terminal on a bottom surface of the JFET chip, where the JFET chips in the chain are connected in series drain-to-source, where the source of the first JFET chip in the chain is connected to the drain of the first MOSFET chip, and where the drain terminal of each JFET chip in the chain is connected to a JFET pad of the conductor layer by a die-attach material; and
e. for each JFET chip in the chain from the second JFET chip to the penultimate JFET chip, a clamping device associated with the JFET chip, where an anode of the clamping device is connected to the source of the JFET chip, and a cathode of the clamping device is connected to the gate of the next JFET chip in the chain,
f. wherein the top surface of the patterned conductor is plated with nickel, gold, or an alloy of nickel or gold.

12. The high-voltage switch module of claim 11, wherein the die-attach material is a solder alloy, silver sintering paste or film, or TLP.

13. The high-voltage switch module of claim 11, further comprising control and output connectors, the control and output connectors being connected to the top surface of the patterned conductor layer by soldering or press-fit.

14. The high-voltage switch module of claim 11, further comprising wire bonding, the wire bonding connecting the source terminal and the gate terminal of each MOSFET chip to the patterned conductor, the wire bonding connecting the source terminal and the gate terminal of each JFET chip to the patterns of the patterned conductor layer.

15. The high-voltage switch module of claim 14, wherein the wire bonding comprises aluminum wire, gold wire, or copper wire.

16. A high-voltage switch module, comprising:
a. an electrically insulating heatsink,
b. a patterned conductor the comprising a top surface and a bottom surface, where the bottom surface of the patterned conductor is bonded directly to a top surface of the heatsink;
c. a first MOSFET chip, the first MOSFET chip being a normally-off n-channel device having a gate terminal and a source terminal formed on a top surface and a drain terminal on a bottom surface, where the drain terminal of the first MOSFET chip is connected to a MOSFET pad of the patterned conductor by a die-attach material;
d. a chain of JFET chips, where the JFET chips in the chain are silicon carbide normally-on n-channel devices having a gate terminal and a source terminal on a top surface of the JFET chip and a drain terminal on a bottom surface of the JFET chip, where the JFET chips in the chain are connected in series drain-to-source, where the source of the first JFET chip in the chain is connected to the drain of the first MOSFET chip, and where the drain terminal of each JFET chip in the chain is connected to a JFET pad of the conductor layer by a die-attach material;
e. for each JFET chip in the chain from the second JFET chip to the penultimate JFET chip, a clamping device associated with the JFET chip, where an anode of the clamping device is connected to the source of the JFET chip, and a cathode of the clamping device is connected to the gate of the next JFET chip in the chain; and f. a housing, the housing being fixed to the insulating heatsink and covering the patterned conductor layer, and the high voltage switch; and g. control and output connectors, the control and output connectors extending beyond the housing.

17. The high-voltage switch module of claim 16, further comprising a sealing material, the sealing material comprising a silicone gel or epoxy.

18. The high-voltage switch module of claim 17, wherein the sealing material encapsulates the patterned conductor layer, the JFET chips, and the MOSFET chip.

19. The high-voltage switch module of claim 16, further comprising an additional clamping device associated with the first JFET chip in the chain where an anode of the additional clamping device is connected to the source of the first MOSFET chip.

20. The high-voltage switch module of claim 16, further comprising:

a. an additional clamping device associated with the first JFET chip in the chain, b. where an anode of the additional clamping device is connected to the source of the first MOSFET chip, c. where a cathode of the additional clamping device is connected to the gate of the second JFET chip, and d. where the gate of the first JFET chip in the chain is connected to the source of the first MOSFET chip.

\* \* \* \* \*